(12) United States Patent
Dunn

(10) Patent No.: US 12,004,311 B2
(45) Date of Patent: *Jun. 4, 2024

(54) HOUSING ASSEMBLY FOR AN INTEGRATED DISPLAY UNIT

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/541,206

(22) Filed: Dec. 15, 2023

(65) Prior Publication Data

US 2024/0114633 A1 Apr. 4, 2024

Related U.S. Application Data

(63) Continuation of application No. 17/239,747, filed on Apr. 26, 2021, now Pat. No. 11,889,636, which is a
(Continued)

(51) Int. Cl.
*H05K 5/00* (2006.01)
*H05K 5/02* (2006.01)
(Continued)

(52) U.S. Cl.
CPC ......... *H05K 5/0017* (2013.01); *H05K 5/0213* (2013.01); *H05K 7/20972* (2013.01); *B29C 48/12* (2019.02); *B29L 2031/003* (2013.01)

(58) Field of Classification Search
CPC ..................................... H05K 5/00
See application file for complete search history.

(56) References Cited

U.S. PATENT DOCUMENTS 2,029,221 A 1/1936 Burgess et al.
2,678,860 A 5/1954 Peterson
(Continued)

FOREIGN PATENT DOCUMENTS

AU 2011248190 B2 5/2011
AU 2014287438 B2 1/2018
(Continued)

OTHER PUBLICATIONS

The Free Dictionary, Bolt—Definition of bolt by The Free Dictionary, Jun. 15, 2016, 1 Page.
(Continued)

*Primary Examiner* — Jerry Wu
(74) *Attorney, Agent, or Firm* — Standley Law Group LLP; Jeffrey S. Standley; Adam J. Smith

(57) ABSTRACT

An electronic display assembly includes an electronic display. An upper portion is supported by a housing assembly above, and spaced apart from, the electronic display, which is also supported by the housing assembly. One or more fans associated with the upper portion move ambient air ingested through one or more intake/exhaust apertures in an upper portion housing, an upper cavity, and a transition area between the upper portion and the electronic display. Ambient air is also ingested through one or more intakes at the transition area by the one or more fans and moved towards one or more open loop airflow pathways extending behind the electronic display.

18 Claims, 12 Drawing Sheets

Related U.S. Application Data continuation of application No. 16/750,429, filed on Jan. 23, 2020, now Pat. No. 11,019,735, which is a continuation of application No. 16/352,041, filed on Mar. 13, 2019, now Pat. No. 10,602,626.

(60) Provisional application No. 62/711,908, filed on Jul. 30, 2018.

(51) Int. Cl.
  *H05K 7/20* (2006.01)
  *B29C 48/12* (2019.01)
  *B29L 31/00* (2006.01)

(56) References Cited

U.S. PATENT DOCUMENTS

| | | |
|---|---|---|
| 3,587,186 A | 6/1971 | Lane |
| 3,984,931 A | 10/1976 | Belokin, Jr. |
| 4,093,355 A | 6/1978 | Kaplit et al. |
| 4,169,327 A | 10/1979 | Stilling |
| 4,267,657 A | 5/1981 | Kloke |
| 4,292,370 A | 9/1981 | Pekko |
| 4,327,513 A | 5/1982 | de Gunzburg |
| 4,327,803 A | 5/1982 | Muellejans et al. |
| 4,452,000 A | 6/1984 | Gandy |
| 4,488,193 A | 12/1984 | Davis et al. |
| 4,547,987 A | 10/1985 | Stilling |
| 4,593,978 A | 6/1986 | Mourey et al. |
| 4,634,225 A | 1/1987 | Haim et al. |
| 4,748,765 A | 6/1988 | Martin |
| 4,759,143 A | 7/1988 | Pomerleau |
| 4,763,993 A | 8/1988 | Vogeley et al. |
| 4,817,317 A | 4/1989 | Kovalak, Jr. |
| 4,903,423 A | 2/1990 | Hinca |
| 4,905,390 A | 3/1990 | Stilling |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,025,355 A | 6/1991 | Harwood |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,179,367 A | 1/1993 | Shimizu |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,299,109 A | 3/1994 | Grondal |
| 5,351,176 A | 9/1994 | Smith et al. |
| 5,423,142 A | 6/1995 | Douglas et al. |
| 5,432,526 A | 7/1995 | Hyatt |
| 5,457,905 A | 10/1995 | Kaplan |
| 5,493,802 A | 2/1996 | Simson |
| 5,535,816 A | 7/1996 | Ishida |
| D373,120 S | 8/1996 | Andre et al. |
| 5,559,614 A | 9/1996 | Urbish et al. |
| 5,621,614 A | 4/1997 | O'Neill |
| 5,657,641 A | 8/1997 | Cunningham et al. |
| 5,717,424 A | 2/1998 | Simson et al. |
| 5,748,269 A | 5/1998 | Harris et al. |
| 5,755,050 A | 5/1998 | Aiken |
| 5,765,743 A | 6/1998 | Sakiura et al. |
| 5,767,489 A | 6/1998 | Ferrier |
| 5,803,424 A | 9/1998 | Keehn et al. |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,899,027 A | 5/1999 | St. Louis |
| 5,903,433 A | 5/1999 | Gudmundsson |
| 5,920,367 A | 7/1999 | Kajimoto et al. |
| D415,736 S | 10/1999 | Witte |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,050,833 A | 4/2000 | Danzyger et al. |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,172,869 B1 | 1/2001 | Hood, III et al. |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,231,446 B1 | 5/2001 | Majima et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,405,463 B1 | 6/2002 | Roddy et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,469,752 B1 | 10/2002 | Ishikawa et al. |
| 6,473,150 B1 | 10/2002 | Takushima et al. |
| 6,476,883 B1 | 11/2002 | Salimes et al. |
| D467,561 S | 12/2002 | Kosciolek |
| 6,493,440 B2 | 12/2002 | Gromatsky et al. |
| 6,494,429 B2 | 12/2002 | Tajima |
| 6,504,713 B1 | 1/2003 | Pandolfi et al. |
| 6,535,266 B1 | 3/2003 | Nemeth et al. |
| 6,557,284 B2 | 5/2003 | Nolan |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,748,685 B2 | 6/2004 | Peel |
| 6,758,002 B1 | 7/2004 | Duguay |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 6,962,528 B2 | 11/2005 | Yokota |
| 7,015,470 B2 | 3/2006 | Faytlin et al. |
| 7,059,757 B2 | 6/2006 | Shimizu |
| 7,083,285 B2 | 8/2006 | Hsu et al. |
| D530,686 S | 10/2006 | Reza |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| D544,848 S | 6/2007 | Marz et al. |
| 7,226,176 B1 | 6/2007 | Huang |
| 7,259,964 B2 | 8/2007 | Yamamura et al. |
| 7,269,023 B2 | 9/2007 | Nagano |
| 7,284,874 B2 | 10/2007 | Jeong et al. |
| 7,292,435 B2 | 11/2007 | She |
| 7,339,782 B1 | 3/2008 | Landes et al. |
| 7,342,789 B2 | 3/2008 | Hall et al. |

(56) References Cited

U.S. PATENT DOCUMENTS

| | | |
|---|---|---|
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,513,830 B2 | 4/2009 | Hajder et al. |
| 7,518,864 B2 | 4/2009 | Kimura |
| 7,535,543 B2 | 5/2009 | Dewa et al. |
| D595,678 S | 7/2009 | Dunn |
| 7,589,958 B2 | 9/2009 | Smith |
| 7,591,508 B2 | 9/2009 | Chang |
| 7,601,067 B2 | 10/2009 | Anderson |
| 7,602,469 B2 | 10/2009 | Shin |
| 7,609,506 B2 | 10/2009 | Aguirre |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,768,775 B2 | 8/2010 | Kim |
| 7,800,706 B2 | 9/2010 | Kim et al. |
| 7,813,124 B2 | 10/2010 | Karppanen |
| 7,903,416 B2 | 3/2011 | Chou |
| D635,614 S | 4/2011 | Yan |
| 7,985,139 B2 | 7/2011 | Lind et al. |
| 7,995,342 B2 | 8/2011 | Nakamichi et al. |
| 8,004,648 B2 | 8/2011 | Dunn |
| 8,006,435 B2 | 8/2011 | DeBlonk et al. |
| 8,016,452 B2 | 9/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,116,081 B2 | 2/2012 | Crick, Jr. |
| 8,142,027 B2 | 3/2012 | Sakai |
| D657,421 S | 4/2012 | Yan |
| D657,422 S | 4/2012 | Yan |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| D669,938 S | 10/2012 | Lard et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,537,302 B2 | 9/2013 | Dunn |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| D704,265 S | 5/2014 | Yan |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,235,232 B2 | 1/2016 | King |
| 9,282,676 B1 | 3/2016 | Diaz |
| 9,285,108 B2 | 3/2016 | Dunn et al. |
| 9,313,447 B2 | 4/2016 | Dunn et al. |
| 9,313,917 B2 | 4/2016 | Dunn et al. |
| 9,317,060 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |

(56) References Cited

U.S. PATENT DOCUMENTS

| | | |
|---|---|---|
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |
| 11,822,171 B2 | 11/2023 | Dunn et al. |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2001/0043290 A1 | 11/2001 | Yamamoto |
| 2001/0043293 A1 | 11/2001 | Inoue |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0039094 A1 | 2/2003 | Sarkinen et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0212548 A1 | 10/2004 | Ruttenberg |
| 2004/0223299 A1 | 11/2004 | Ghosh |
| 2004/0257492 A1 | 12/2004 | Mai et al. |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0105178 A1 | 5/2005 | Kim |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0137294 A1 | 6/2006 | Waits et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0215421 A1 | 9/2006 | Chang et al. |
| 2006/0218828 A1 | 10/2006 | Schrimpf et al. |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139574 A1 | 6/2007 | Ko et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0253205 A1 | 11/2007 | Welker |

(56) References Cited

U.S. PATENT DOCUMENTS

| | | |
|---|---|---|
| 2007/0267174 A1 | 11/2007 | Kim |
| 2008/0002350 A1 | 1/2008 | Farrugia |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0100186 A1 | 5/2008 | Li |
| 2008/0148609 A1 | 6/2008 | Ogoreve |
| 2008/0165496 A1 | 7/2008 | Kang et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0255901 A1 | 10/2008 | Carroll et al. |
| 2008/0267790 A1 | 10/2008 | Gaudet et al. |
| 2008/0276507 A1 | 11/2008 | Hines |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0304219 A1 | 12/2008 | Chen |
| 2008/0310116 A1 | 12/2008 | O'Connor |
| 2008/0310158 A1 | 12/2008 | Harbers et al. |
| 2009/0009041 A1 | 1/2009 | Zeidler |
| 2009/0009047 A1 | 1/2009 | Yanagawa et al. |
| 2009/0009729 A1 | 1/2009 | Sakai |
| 2009/0016004 A1 | 1/2009 | McCoy |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0141199 A1 | 6/2009 | Fujikawa |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissiere |
| 2009/0241388 A1 | 10/2009 | Dunn |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0278007 A1 | 11/2009 | Taylor |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019348 A1 | 1/2011 | Kludt et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0227467 A1 | 9/2011 | Foppe, Jr. et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0050958 A1 | 3/2012 | Sanford et al. |
| 2012/0105424 A1 | 5/2012 | Lee et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0253672 A1 | 10/2012 | Hoshino et al. |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0211583 A1 | 8/2013 | Borra |
| 2013/0258659 A1 | 10/2013 | Erion |
| 2013/0270975 A1 | 10/2013 | Dunn et al. |
| 2013/0279154 A1 | 10/2013 | Dunn |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0208626 A1 | 7/2014 | Moon |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |

(56) References Cited

U.S. PATENT DOCUMENTS

| | | |
|---|---|---|
| 2016/0014910 A1 | 1/2016 | Campagna et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1* | 3/2017 | Bowers .................. G06F 1/20 |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1* | 11/2017 | Hong .................. G09F 9/30 |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0059175 A1 | 2/2019 | Diaz |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0096797 A1 | 3/2020 | Teragawa |
| 2020/0154597 A1 | 5/2020 | Dunn et al. |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |
| 2023/0345683 A1 | 10/2023 | Dunn et al. |
| 2023/0359077 A1 | 11/2023 | Dunn et al. |
| 2023/0422431 A1 | 12/2023 | Dunn et al. |
| 2023/0422453 A1 | 12/2023 | Dunn |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A0 | 1/2019 |
| EP | 3468321 A1 | 4/2019 |
| EP | 3138372 B1 | 5/2019 |

(56) References Cited

FOREIGN PATENT DOCUMENTS

| | | |
|---|---|---|
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| GB | 153110 | 11/1920 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H11-68363 A | 3/1999 |
| JP | 11160727 A | 6/1999 |
| JP | H11296094 A | 10/1999 |
| JP | 2000-10501 A | 1/2000 |
| JP | 2000131682 A | 5/2000 |
| JP | 3118907 B2 | 10/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2003-162228 A | 6/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2005134849 A | 5/2005 |
| JP | 2005265922 A | 9/2005 |
| JP | 2005292939 A | 10/2005 |
| JP | 2005332253 A | 12/2005 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 | 8/2006 |
| JP | 2006-330196 A | 12/2006 |
| JP | 2007003638 A | 1/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 200236278 Y1 | 10/2001 |
| KR | 10-2067751 B1 | 1/2002 |
| KR | 2002-0057425 A | 7/2002 |
| KR | 200286961 Y1 | 8/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 10-2007-0048300 A | 5/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011059793 A2 | 5/2011 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012006620 A2 | 1/2012 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |

(56) References Cited

FOREIGN PATENT DOCUMENTS

OTHER PUBLICATIONS

The Free Dictionary, Screw—Definition of screw by The Free Dictionary, Jun. 15, 2016, 1 Page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
CIVIQ, Invalidity Claim Chart, Appendix E, Jan. 24, 2018, 28 pages.
CIVIQ, Smart City Devices, webpage, Jan. 30, 2019, 5 pages.
CIVIQ, Smart City Platform, webpage, Jan. 30, 2019, 10 pages.
CIVIQ, Smartscapes devices, webpage, Jan. 30, 2019, 1 page.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., Emc analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
CIVIQ Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
CIVIQ, Invalidity Claim Charts, Appendix A-Appendix D, Jan. 24, 2018, 51 pages.
CIVIQ, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
CIVIQ, Invalidity Claim Chart, Appendix I, Mar. 22, 2018, 4 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
*CIVIQ Smartscapes, LLC v. Manufacturing Resources International, Inc.*, Memorandum Opinion re claim construction, Sep. 27, 2018, 16 pages.
*CIVIQ Smartscapes, LLC v. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Company.
*CIVIQ Smartscapes LLC. v Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*CIVIQ Smartscapes LLC. v Manufacturing Resources International, Inc.*, Defendant's Amended Answer and Counterclaims to Plaintiff's First Amended Complaint, Filed Apr. 24, 2018, 240 pages.
*CIVIQ Smartscapes, LLC v. Manufacturing Resources International, Inc.*, Memorandum Order re "rear surface of the electronic display" term construction, Mar. 5, 2019, 3 pages.

\* cited by examiner

HOUSING ASSEMBLY FOR AN INTEGRATED DISPLAY UNIT

CROSS-REFERENCE TO RELATED APPLICATION

This application is a continuation of U.S. Non-provisional patent application Ser. No. 17/239,747 filed Apr. 26, 2021, which is a continuation of U.S. Non-provisional patent application Ser. No. 16/750,429 filed Jan. 23, 2020, now U.S. Pat. No. 11,019,735 issued May 25, 2021, which is a continuation of U.S. Non-provisional patent application Ser. No. 16/352,041 filed Mar. 13, 2019, now U.S. Pat. No. 10,602,626 issued Mar. 24, 2020, which claims the benefit of U.S. Provisional Patent Application Ser. No. 62/711,908 filed Jul. 30, 2018, the disclosures of each of which are hereby incorporated by reference as if fully restated herein.

TECHNICAL FIELD

Exemplary embodiments relate generally to a system and method for providing a housing assembly for an integrated display unit.

BACKGROUND AND SUMMARY OF THE INVENTION

Electronic displays and associated equipment are increasingly being used in cities and other urban environments, shopping malls, retail outlets, restaurants, sporting venues, universities, educational centers, medical facilities, and other business and public locations for advertising, messaging, wayfinding, public emergency notifications, and the like. Such electronic displays are often placed in partially or completely ruggedized units, to protect the various components of the electronic displays and associated equipment from the environmental elements, vandalism, and the like. Such display units may comprise various electronic components necessary to power, operate, remotely manage content, remote monitoring of the systems health status, and thermally manage the electronic displays and associated equipment.

Such display units are generally placed within a separate outer shell. As aesthetics are important when placing such display units in public locations, the outer shell may comprise a variety of decorative components. The outer shell may be configured for, but not limited to, mounting to the ground, street, sidewalk, existing street lighting poles, exterior or interior walls, flat bed trailers for mobile deployment, or the like. Alternatively, or in addition, as space is often limited in such public locations, the outer shell may be provided in the form of street furniture such as, but not limited to, benches, bus shelters, kiosks, wayfinding units, telephone booths, or the like. In other exemplary embodiments, the outer shell may be configured for suspension from an overhead member, elevated from the ground, or secured in a storefront window to name a few examples.

In many cases, the display unit is designed and manufactured by one individual or entity while the outer shell is designed and manufactured by another individual or entity. In such cases, the display unit designer and manufacturer must work with the outer shell designer and manufacturer to ensure compatibility of the display unit with the outer shell. The processing of making the display unit compatible with the outer shell is time consuming and expensive and often requires design changes and compromises by both parties. Even where the display unit and outer shell designer and manufacturer are one and the same, the display unit is often manufactured as a single, sealed unit and the outer shell is likewise often manufactured as a separate unit configured to receive the display unit. This results in a protective shell (the display unit) placed within a second semi-protective, functional, or aesthetic outer shell. Such an arrangement results in added manufacturing complexity, weight, cost, and the like. Therefore, what is needed is a housing assembly for an integrated display unit.

These disclosures provide a housing assembly for an integrated display unit. The housing assembly may serve as both the outer shell as well as the frame for the display unit. This may reduce complexity, costs, weight, simplify the design, and the like. A first and second side housing member may be configured to receive a first and second horizontal member. The first and second side housing member may extend substantially vertical, spaced apart from one another, and substantially parallel with one another from a bottom horizontal member. The first and second side housing members may form at least a portion of the side walls of the display unit, thereby at least partially, or in some cases fully, sealing the display unit.

The first and second horizonal members may extend between the first and second side housing members. The first and second horizontal members may extend substantially horizontal, spaced apart from one another, and substantially parallel with one another. The first and second horizontal members may form at least a portion of the top and bottom of the display unit, thereby at least partially sealing, or in some cases fully, the display unit. A first and second receiving section may be located near the bottom of the housing assembly and may be configured to receive external supports for mounting to the street, sidewalk, ground, pole, wall, or other surface. The display unit may comprise an open loop pathway for ambient air which thermally interacts with a closed loop pathway for circulating gas.

The first and second side housing members may comprise one or more channels configured to receive corresponding protrusions on the first and second horizontal members. The channels may be configured to permit vertical placement of the first and second horizontal members within the first and second side housing members in a substantially sealed arrangement. Each of the first and second side housing members may comprise a first and second raised edge which permits the snap fitting of decorative cladding or fascia.

The housing assembly may comprise an upper portion for housing additional equipment. The upper portion may comprise a frame which is secured to the display unit and an upper portion housing. The upper portion housing may be configured to receive the additional equipment. One or more of sides of the upper portion housing, such as but not limited to the vertical or horizontal sides, may be comprised of glass or other low loss, low attenuation materials to enable the broadcast and reception of broadband radio frequencies.

A transition area may extend between the display unit and the upper portion. A common open loop intake may ingest ambient air, a first portion of which may travel into an open loop pathway of the display unit and a second portion of which may travel into the upper portion. In other embodiments, the common open loop intake may be provided for both the upper portion and the display unit which may be one in the same.

One or more upper portion intake apertures may be located in the upper portion housing to permit the ingestion of ambient air. For example, without limitation, an open loop aperture may be provided in the upper portion which draws in ambient air for both the upper portion and the display unit.

In other exemplary embodiments, a vent may extend along an upper portion of the upper portion housing to permit the exhaustion of ambient air ingested into the upper portion. In such embodiments, one or more fans may be positioned on or near the upper portion intake apertures to encourage or force such ingestion as well as circulation within the upper portion housing and exhaustion from the vent. In other embodiments, the upper portion may be cooled by convection through ambient air passing over the external surfaces of the upper portion.

Further features and advantages of the devices and systems disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
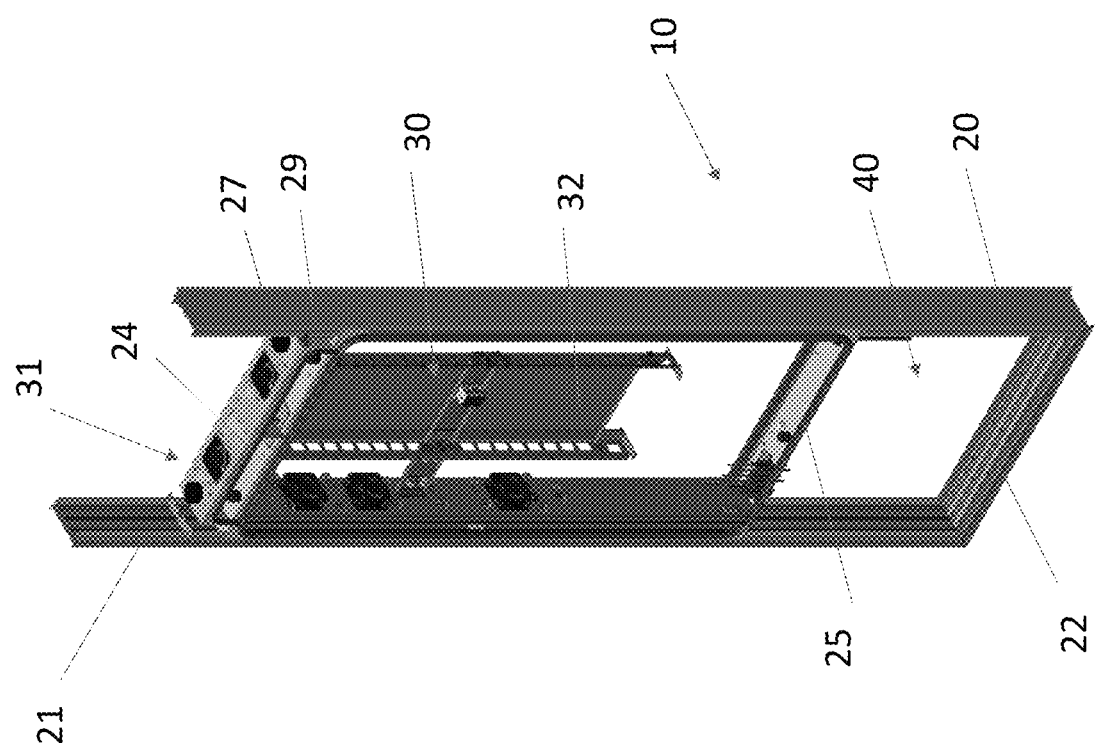
FIG. 1 is a front perspective view of an exemplary housing assembly and an integrated display unit with certain components removed for clarity.

FIG. 1 is a front perspective view of an exemplary housing assembly 10 for an integrated display unit 30. FIG. 1 illustrates some, but not all, components of the display unit 30. The display unit 30 may comprise one or more electronic displays (including associated backlights), fans, electronic components for operating the electronic displays, customer equipment, cameras, microphones, computing devices, environmental sensors, communications equipment, USB charging stations, audio speakers, and the like (hereinafter also referred to generally as "equipment"). In some embodiments, the display unit 30 may comprise a first and second electronic display placed above and below one another. The lower display may be located to meet ADA standards. In some embodiments, the integrated display unit may have electronic displays on one, both, or all sides of the housing assembly 10. The display unit 30 may define a cavity and may comprise one or more storage devices 32 located in said cavity and configured to hold or otherwise secure such components and equipment. Such storage devices 32 may include, server racks, brackets, bins, shelves, posts, mounts, and the like, such as but not limited to, a 1U server rack.

The display unit 30 may comprise an open loop pathway for ambient air. The display unit 30 may further comprise a closed loop pathway for circulating gas. The open loop pathway and the closed loop pathway may be configured to permit thermal interaction of the ambient air in the open loop pathway with the circulating gas in the closed loop pathway. For example, without limitation, such thermal interaction may be provided at a heat exchanger.

Figure 2:
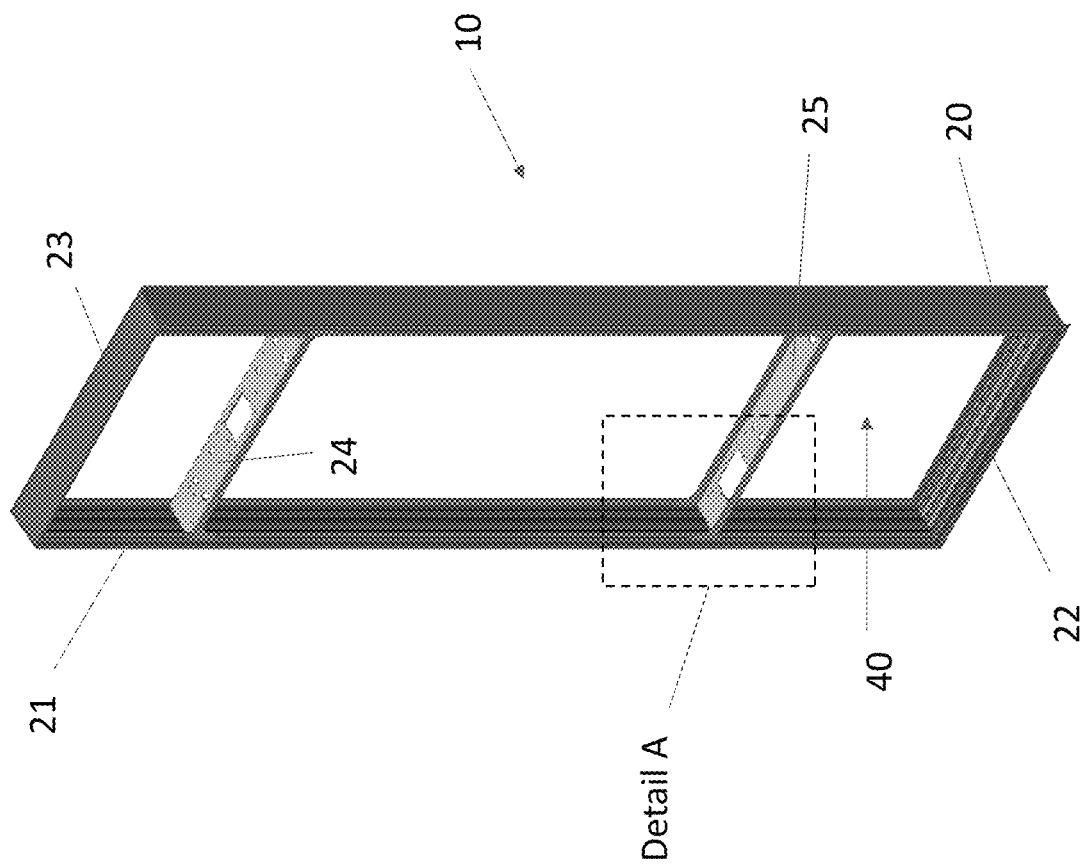
FIG. 2 is a front perspective view of the housing assembly of FIG. 1 with additional components removed for clarity and also indicating Detail A.

Exemplary arrangements, without limitation, of such display units 30 comprising open loop pathways and closed loop pathways are shown and described in U.S. Application Ser. No. 12/234,307 filed Sep. 19, 2008, Ser. No. 12/556,029 filed Sep. 9, 2009, and Ser. No. 12/753,298 filed Apr. 2, 2010, the discloses of all of which are hereby incorporated by reference in their entireties. Another exemplary display unit 30 is shown and described in U.S. application Ser. No. 15/886,889 filed on Feb. 2, 2018, which is hereby incorporated by reference in its entirety. Other exemplary display units 30 may be available from Manufacturing Resources International, Inc. of Alpharetta, Georgia (https://mri-inc.net/). The provided examples are not intended to be limiting. Furthermore, these display units 30 may, in some cases, be referred to as Panel Display Modules ("PDM"). The term PDM is not intended to require any particular type, design, or configuration of display unit. Any type of display unit 30 having any number of components in any arrangement is contemplated. FIG. 2 is a front perspective view of the housing assembly 10 with certain components of the display unit 30 removed for clarity. The housing assembly 10 may comprise a first side housing member 20 and a second side housing member 21. The first and second side housing members 20 and 21 may form a portion of the outer surface of the housing assembly 10. In exemplary embodiments, the first and second side housing members 20 and 21 may be spaced apart from one another and extend substantially vertical, though any arrangement is contemplated. The first and second side housing members 20 and 21 may extend substantially parallel with one another, though such is not required. In exemplary embodiments, the first and second side housing members 20 and 21 may form at least a portion of the sidewalls of the display unit 30. The first and second side housing members 20 and 21 may be configured to partially or fully seal the display unit 30.

A bottom horizontal member 22 may extend between the first and second side housing members 20 and 21. In exemplary embodiments, the bottom horizonal member 22 may extend between the distal end of the first and second side housing members 20 and 21. A top horizontal member 23 may likewise extend between the first and second side housing members 20 and 21. In exemplary embodiments, the top horizonal member 23 may extend between a proximal end of the first and second side housing members 20 and 21. The top and bottom horizontal members 23 and 22 may be comprised of metal and may be welded to the first and second side housing members 20 and 21. The top and bottom horizontal members 23 and 22 may be spaced apart from one another and extend substantially parallel to one another, though such is not required.

A first horizontal member 24 and a second horizontal member 25 may each extend between the first and second side housing members 20 and 21. In exemplary embodiments, the first and second horizontal members 24 and 25 are spaced apart from one another and extend substantially horizontal, though any arrangement is contemplated. The first and second horizontal members 24 and 25 may extend substantially parallel with one another, though such is not required. In exemplary embodiments, the first and second horizontal members 24 and 25 may form at least a portion of the upper and lower seal for the display unit 30. The first and second horizontal members 24 and 25 may be configured to partially or fully seal the display unit 30. It is contemplated that at least a portion 31 of the display unit 30 may extend above or below the first and/or second horizontal members 24 and 25.

The first and second side housing member 20 and 21 may replace the side walls of the display unit 30. Similarly, the first and second horizontal member 24 and 25 may replace the top and bottom walls of the display unit 30. Such an arrangement may simplify the design and reduce manufacturing costs and complexity.

Figure 4:
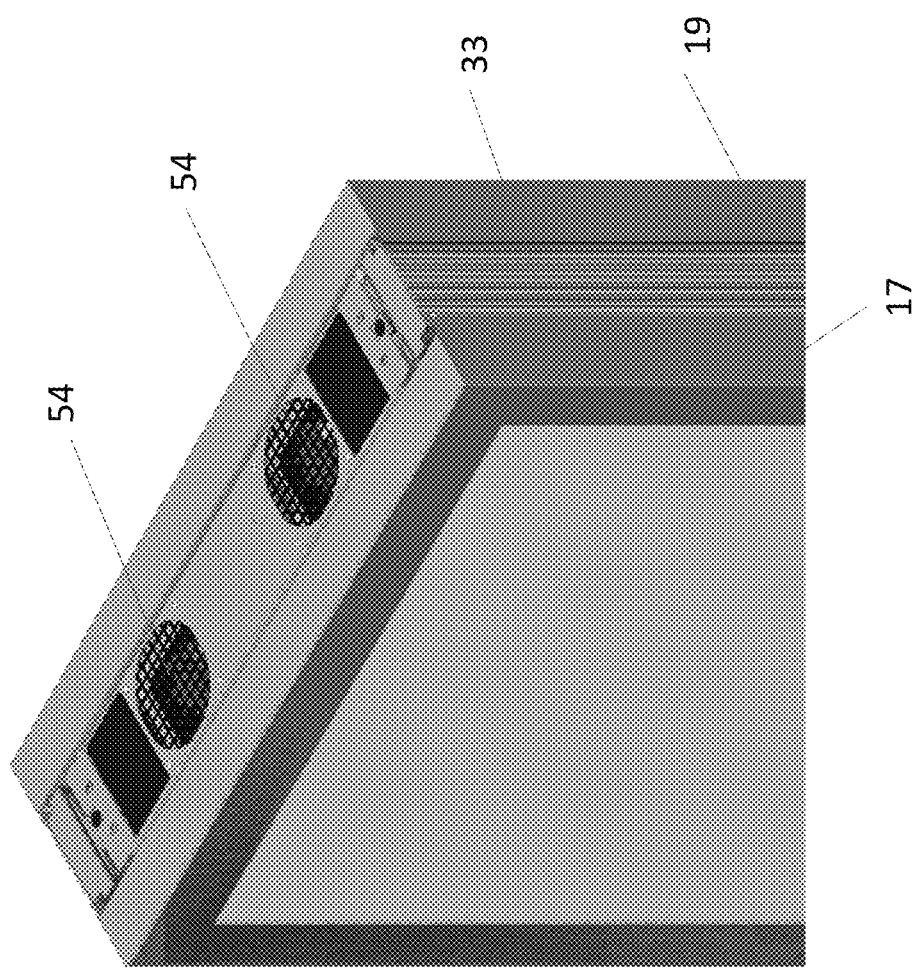
FIG. 4 is a detailed front perspective view of the housing assembly with exemplary external cladding installed.

The housing assembly 10 may comprise decorative outer features, such as but not limited to, cladding 33 as shown in FIG. 4, for example without limitation. The housing assembly 10 may be configured for mounting to the ground, street, sidewalk, wall, pole, a flatbed truck for mobile deployment, an interior wall, an exterior wall, or any other surface. The housing assembly 10 may, alternatively or in addition, comprise street furniture such as, but not limited to, benches, bus shelters, kiosks, wayfinding units, telephone booths, or the like. In other exemplary embodiments, the housing assembly 10 may be configured for suspension from an overhead member, elevated from the ground, or secured in a storefront window.

In exemplary embodiments, the housing assembly 10, particularly the area located below the second horizontal member 25 and between the first and second side housing members 20 and 21 may define a cavity 40. The cavity 40 may be kept intentionally free of components or equipment, particularly water sensitive electronic equipment. In this way, certain levels of flooding will not damage any such equipment or components.

Figure 3:
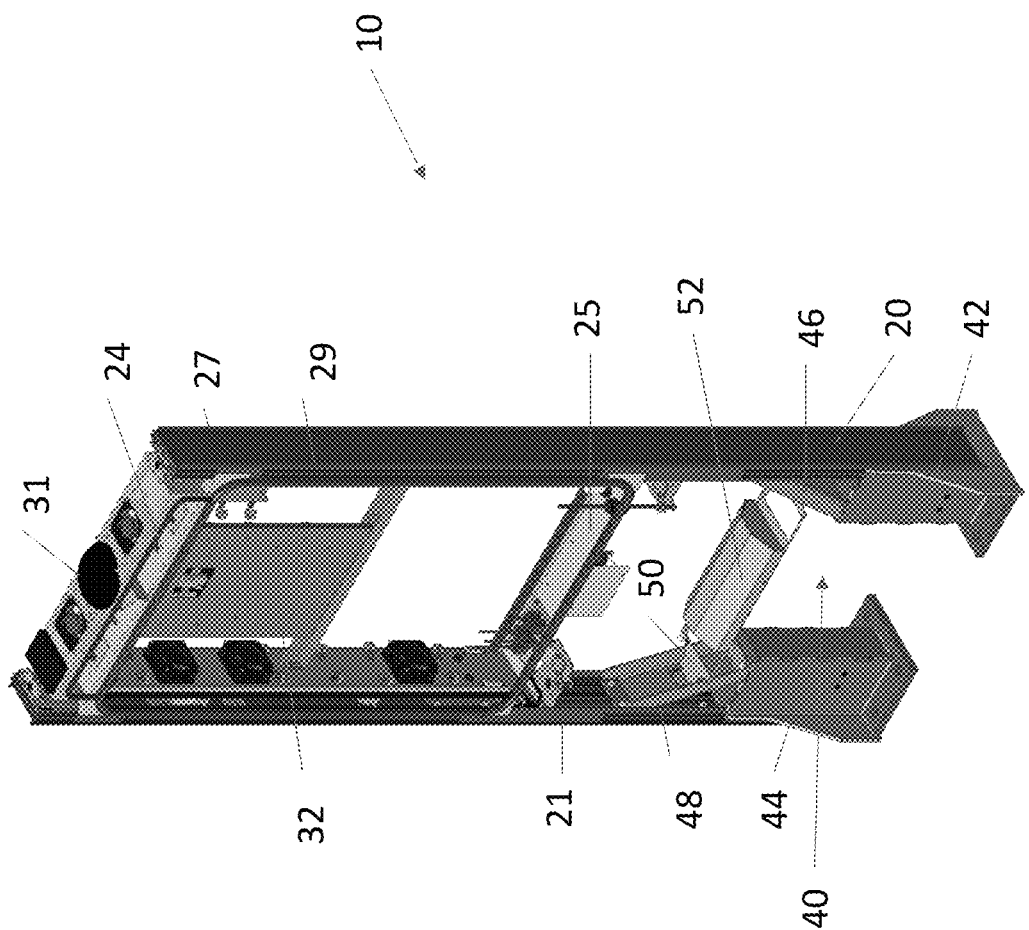
FIG. 3 is a front prospective view of another exemplary housing assembly and integrated display unit with certain components removed for clarity.

FIG. 3 is a front prospective view of another exemplary housing assembly 10 with certain components removed for clarity. The housing assembly 10 may be configured to mate with external supports. For example, without limitation, the housing assembly 10 may comprise a first and second receiving section 42 and 44, which may be located on a lower portion of the first and second side housing members 20 and 21, respectively. The first and second receiving sections 42 and 44 may be substantially rectangular in shape, though any shape in contemplated. The first and second receiving sections 42 and 44 may be configured to receive one or more external supports, which may be mounted to the ground, parking lot, sidewalk, or other surface, and may extend therefrom and into the first and second receiving sections 42 and 44 where they may be secured. A first and second angled member 46 and 48 may extend at an angle from the first and second side housing members 20 and 21, respectively, to the first and second receiving sections 42 and 44, respectively. The first and second angled members 46 and 48 may be configured to increase structural stability to the housing assembly 10, particularly lateral stability and rigidity.

In some embodiments, a horizontal support member 50 may extend between the first and second angled members 46 and 48. A second storage device 52 may be located on the horizontal support member 50 any may be configured to receive additional components for operating the electronic displays or other peripherals and/or customer equipment.

The first side housing member 20 and the second side housing member 21 may each comprise a first raised edge 27 and a second raised edge 29. The first and second raised edges 27 and 29 may extend the length of the first and second side housing members 20 and 21, respectively, though such is not required. The first and second raised edges 27 and 29 may extend substantially parallel with one another. The first and second raised edges 27 and 29 may extend along either edge of the first and second side housing members 20 and 21, respectively. The first and second raised edges 27 and 29 may be configured to accept one or more pieces of cladding 33. Such cladding 33 may be snap fit, press fit, or otherwise configured to mate with the first and second raised edges 27 and 29.

It is notable that while several of the embodiments shown herein illustrate display units 30 comprising electronic display oriented in a substantially portrait orientation. However, it is contemplated that one or more of the electronic display in one or more display units 30 may likewise be placed in a landscape orientation.

Figure 5:
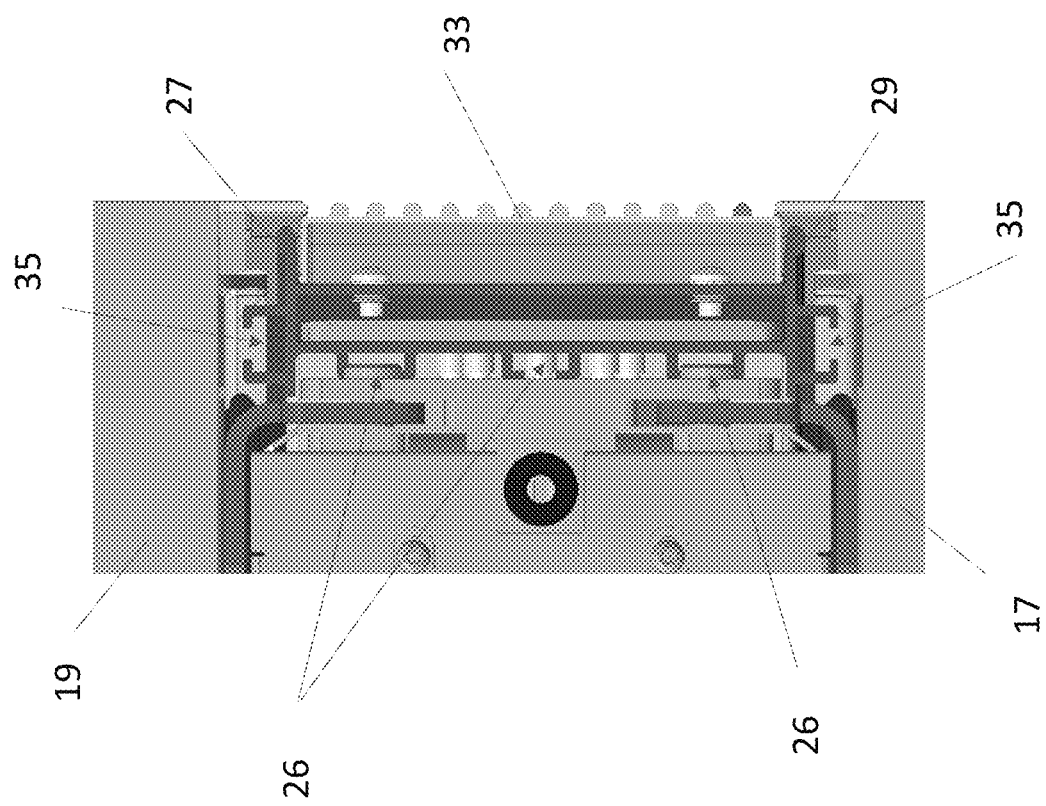
FIG. 5 is a detailed top sectional view of the housing assembly of FIG. 4.

FIG. 4 is a front perspective view of the housing assembly 10 with exemplary cladding 33 installed. The housing assembly 10 may comprise a front housing portion 17 and a rear housing portion 19. The front housing portion 17 may house a first electronic display and the rear housing portion 19 may house a second electronic display, though such is not required. One or more ambient air intakes 54 may be located within the housing assembly 10. The ambient air intakes 54 may form a part of the open loop pathway and may be configured to ingest ambient air. The front housing portion 17 and the rear housing portion 19 may be mounted to the remainder of the housing assembly 10 in a hinged manner. FIG. 5 is a detailed top sectional view of the housing assembly 10. The cladding 33 may be of any size, shape, and texture. In exemplary embodiments, various types of cladding 33 and decorative features may be interchangeably mounted to the first and second raised edges 27 and 29 such that the external appearance of the housing assembly 10 may be altered as desired.

Figure 6:
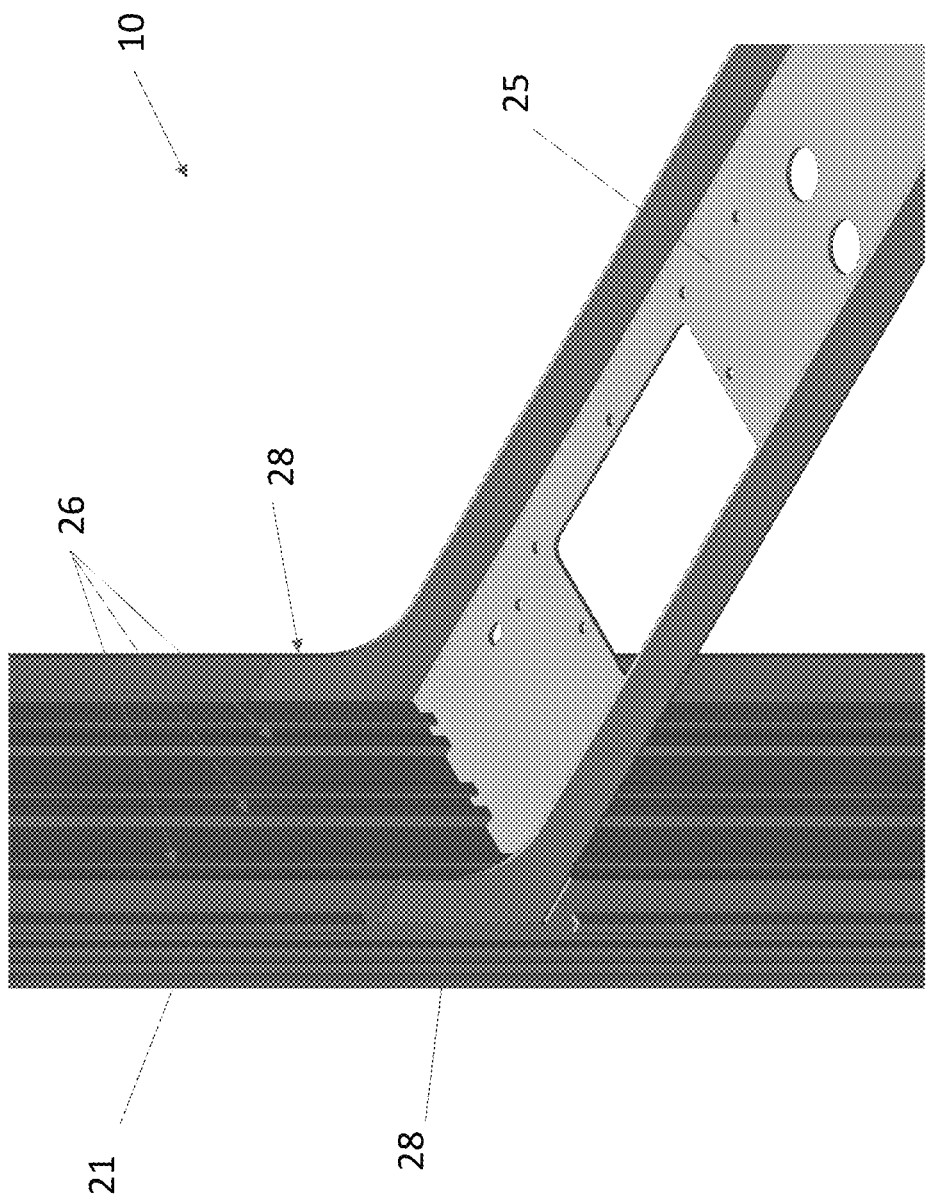
FIG. 6 is a detailed front perspective view of Detail A of FIG. 2.

FIG. 6 is a detailed front perspective view of Detail A in FIG. 2. The first and second side housing members 20 and 21 may each comprise one or more channels 26 configured to receive corresponding protrusions or fasteners in the second horizontal member 25 to join the second horizontal member 25 to the first or second side housing members 20 or 21, respectively. In exemplary embodiments, the channels 26 may extend the entire length of the first or second side housing members 20 and 21, though such is not required. The channels 26 may be configured to permit the vertical placement and movement of the second horizontal member 25 along the first and second side housing members 20 and 21.

The first and second side housing members 20 and 21 may each further comprise one or more additional channels 35. The additional channels 35 may be configured to receive corresponding protrusions or fasteners in the front or rear housing portions 17 and 19, respectively.

The first and second side housing members 20 and 21 may each further comprise a first and a second notch configured to receive a corresponding protrusion 28 in the second horizontal member 25. In exemplary embodiments, the first and second notch are located on the outside of the first or second side housing member 20 or 21. The first and second notch and corresponding protrusion 28 may be configured to secure the second horizontal member 25 at a vertical location along the first or second side housing member 20 or 21. An identical or similar set of first and second notches may be located in an upper portion of the first and second side housing members 20 and 21 and may be configured to receive identical or similar protrusions in the first horizontal member 24. In this way, the first horizontal member 24 may be secured at a position along the first and second side housing members 20 and 21 above the second horizontal member 25.

In exemplary embodiments, the first and second side housing members 20 and 21, including the channels 26, may be formed by extrusion. Similarly, the first and second horizontal members 24 and 25 may likewise be formed by extrusion. Such extrusion may advantageously permit various size housing assemblies 10 to be formed. This may be particularly advantageous for accommodating various size electronic displays. The first and second side housing members 20 and 21 may be comprised of a metal, such as but not limited to, aluminum, steel, titanium, or the like. Alternatively, or in addition, the first and second side housing members 20 and 21 may be comprised of a polymer or the like.

Figure 7:
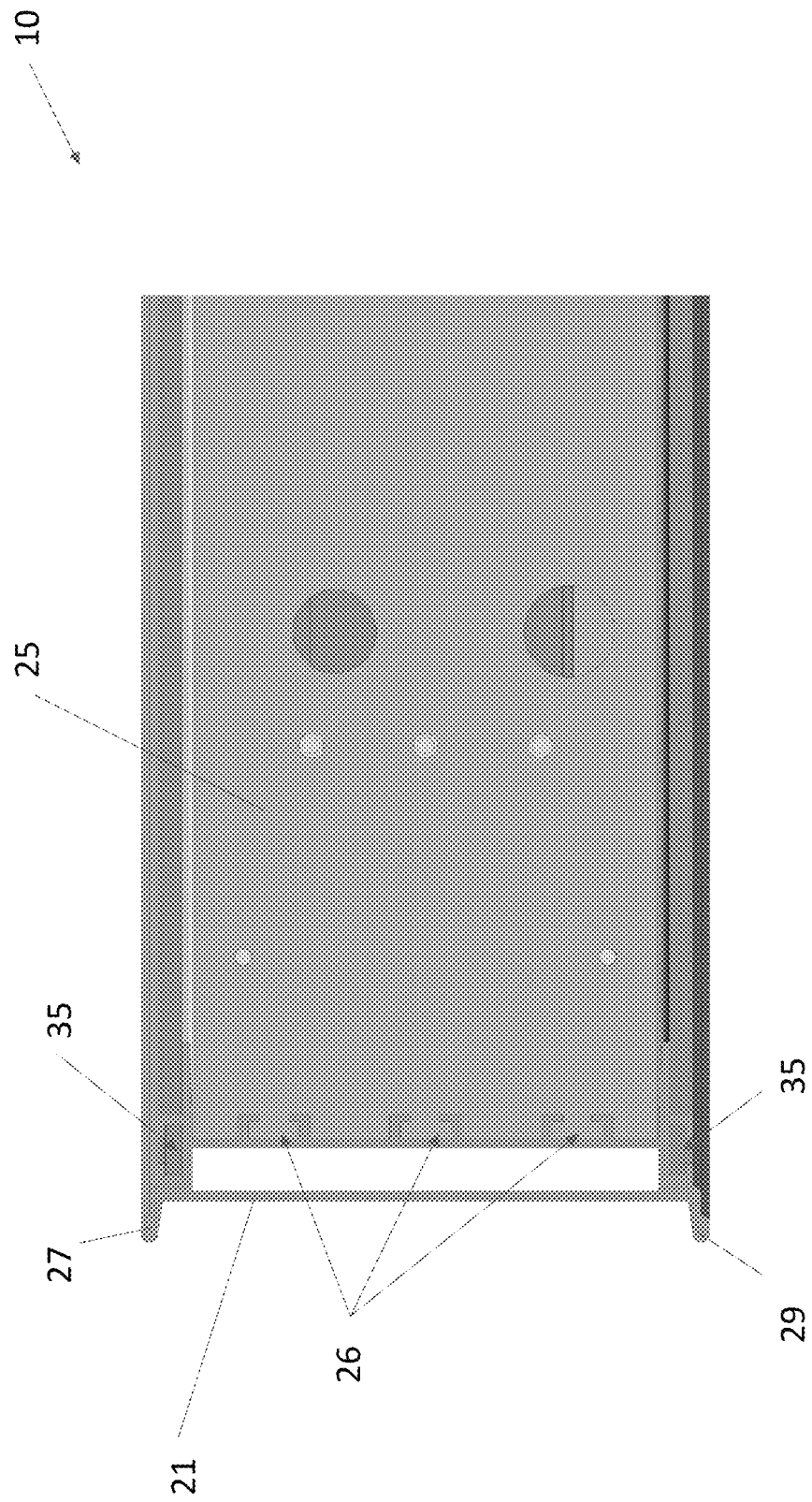
FIG. 7 is a top view of Detail A of FIG. 6.

FIG. 7 is a top view of Detail A of FIG. 3. The channels 26, and the additional channels 35, may comprise substantially "C" shaped brackets, though any shape, arrangement, and number of channels 26, and additional channels 35, are contemplated. The channels 26, and the additional channels 35, may be configured to receive corresponding protrusions in the second horizontal member 25. The channels 26, and the additional channels 35, may be further configured to receive any number of components, such as but not limited to, various components of the housing assembly 10 and/or the display unit 30.

While some of the figures herein are illustrated with regards to one of the first or second side housing members 20 or 21 as well as the first or second horizontal member 24 or 25, it is contemplated that the same, or a substantially similar, arrangement may be utilized with respect to any of the aforementioned components.

Figure 8:
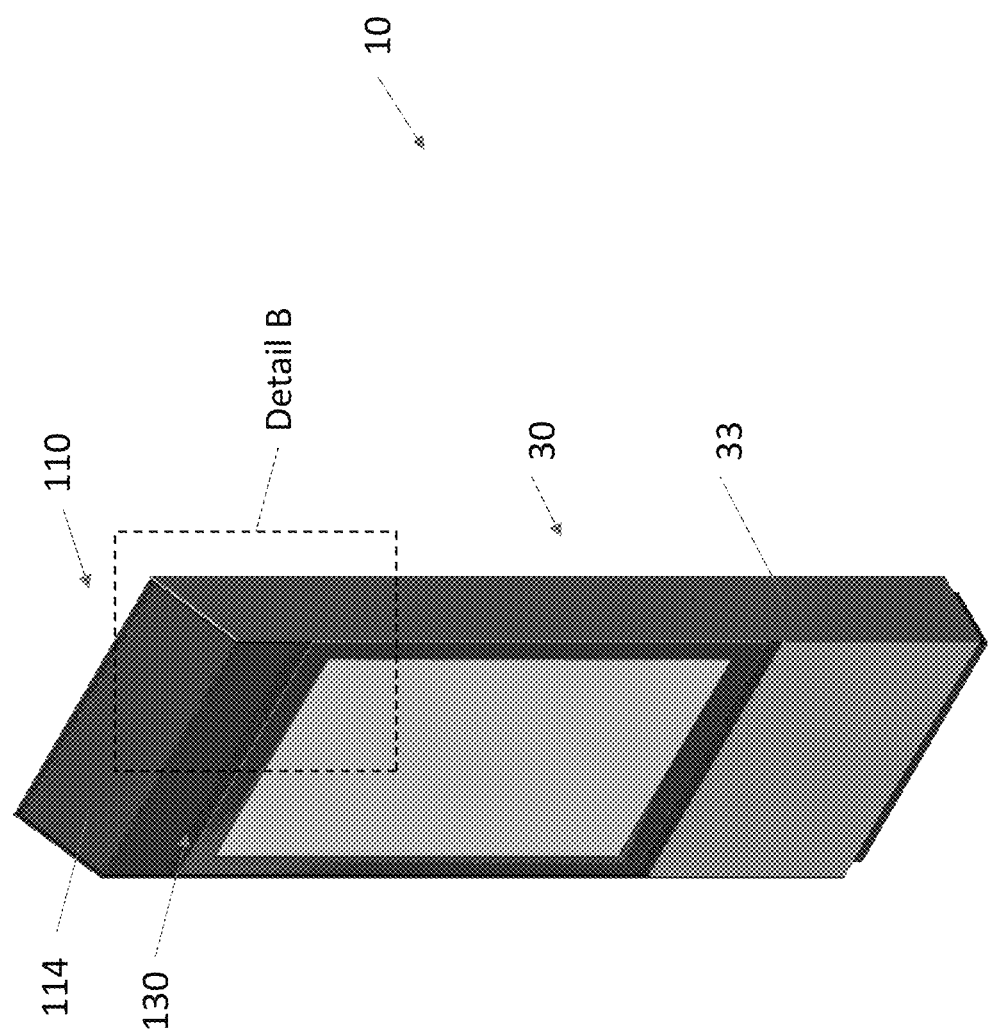
FIG. 8 is a front perspective view of the housing assembly with exemplary external cladding and an exemplary upper portion installed also indicating Detail B.
Figure 9A:
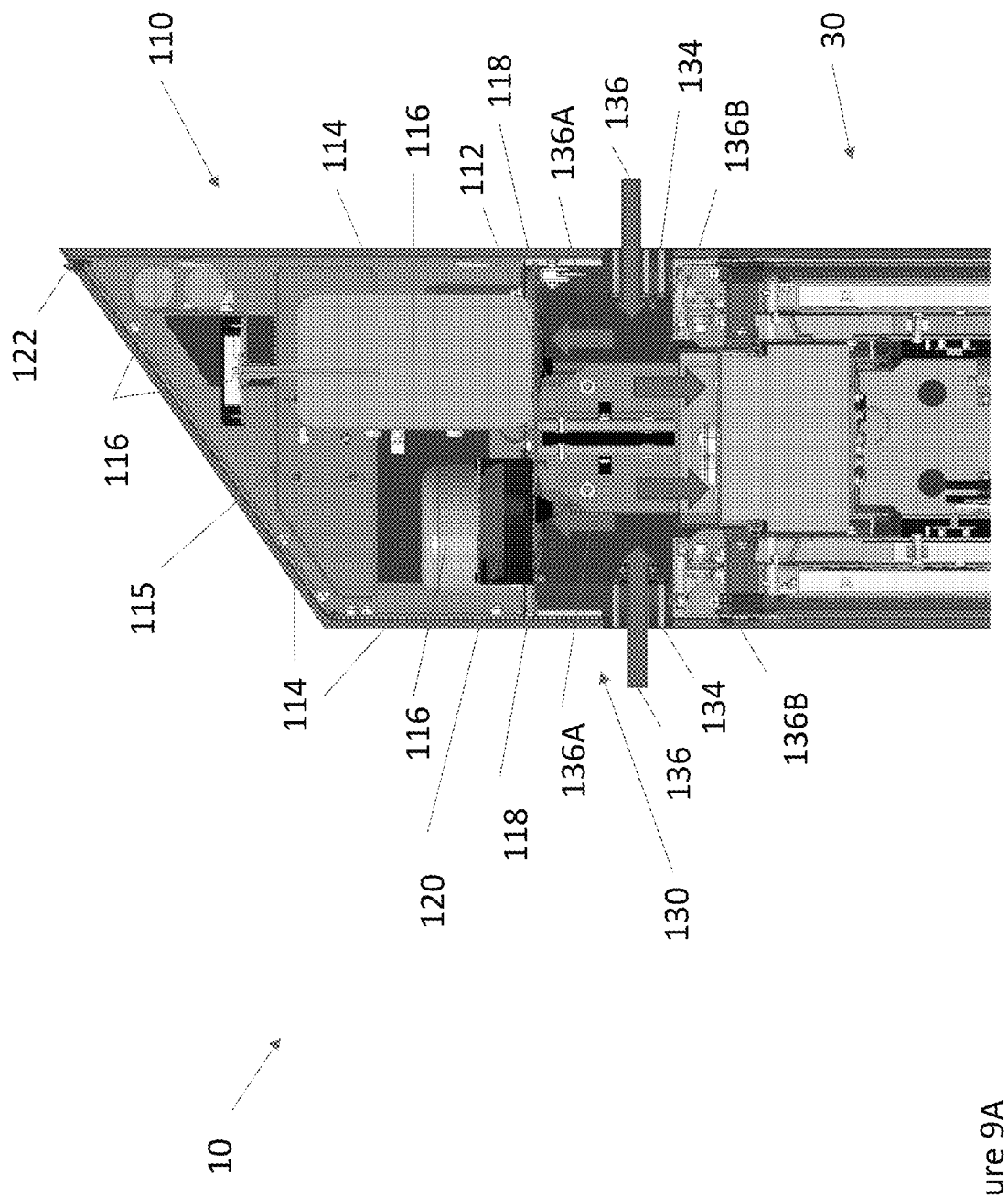
FIG. 9A is a detailed side sectional view of Detail B of FIG. 8.

FIG. 8 is a front perspective view of the housing assembly 10. The housing assembly 10 may comprise an upper portion 110, though particularly as illustrated with respect to FIG. 4, such is not required. FIG. 9A is a detailed side sectional view of Detail B of FIG. 8.

The upper portion 110 may extend above the display unit 30. A frame 112 may extended between and secure the upper portion 110 to the display unit 30. The frame 112 may comprise any number of members. An upper portion housing 114 may define an upper portion cavity 115 which may be sized to receive additional equipment 116, such as but not limited to, antennas, power over ethernet equipment, cellular radio, wireless routers and connectivity equipment, and other network communication devices as well as environmental sensors, air quality monitors, cameras, microphones, computing devices, proximity sensors, speakers, and the like, though such is not required. Various mounting devices may be located inside the upper portion 110 to accommodate the additional equipment 116, though such is not required. For example, without limitation, the upper portion 110 may be included for aesthetic reasons or standardization of manufacturing purposes but may be substantially empty. One or more members of the frame 112 may be hollow so as to accommodate power lines, communication lines, and the like. The power lines, communication lines, and the like may extend to power supplies, communications equipment, or networked equipment located in the display unit 30 or external to the housing assembly 10. In this way, power and communications may travel to and from the display unit 30 and the upper portion 110 as well as to and from sources outside of the housing assembly 10 (e.g., networks, utilities, and the like). In exemplary embodiments, when placed in a closed position, the upper portion 110 may form a substantially watertight enclosure, though such is not required.

One or more sides of the upper portion housing 114 may be mounted to the frame 112 in a hinged fashion so as to selectively permit access to the additional equipment 116. One or more struts, gas springs, prop rods, or the like may extend between the frame 112 and the hinged portions of the upper portion housing 114. Such sides of the upper portion housing 114 may be selectively attached to other sides of the upper portion housing 114 and/or the frame 112 by way of latches, such as but not limited to, magnets, slam latches, or the like. In other exemplary embodiments, one or more panels of the upper portion housing 114 may be slid in various directions, such as but not limited to along rails, in order to permit access to the inside of the upper portion 110.

One or more sides of the upper portion housing may be comprised of glass, such as but not limited to black glass, or other radio permissive material such that broadband radio and other waves emitted from and transmitted to the additional equipment 116 may enter and exit the upper portion housing 114.

In exemplary embodiments, the housing assembly 10 may comprise a transition area 130 located between the upper portion 110 and the display unit 30. The upper portion housing 114 may extend into the transition area 130 to partially enclose the transition area 130. In other exemplary embodiments, a separate transition housing may be used. The transition area 130 may comprise a common open loop intake 134. Open loop fluids, such as ambient air 136 may be ingested through the common open loop intake 134 and may be separated such that a first flow 136A of the ingested ambient air travels into the upper portion 110 and a second flow 136B of the ingested ambient air travels into the display unit 30. A grid, screen, mesh, filter, or the like may be placed on, over, or near the open loop intake 134, though such is not required.

In exemplary embodiments, a first open loop intake 134 may be located on one side of the housing assembly 10, and a second open loop intake 134 may be located on another side of the housing assembly 10. The frame 112 may extend through the transition area 130 and may separate the ambient air 136 ingested from first open loop intake 134 from the ambient air ingested from the second open loop intake 134, though such is not required.

In some embodiments, one or more upper portion apertures 118 may be located in the upper portion housing 114 to permit the first flow 136A to enter the upper portion 110. One or more fans 120 may be positioned on or near the upper portion apertures 118 to encourage or force such ingestion and exhaustion of ambient as well as circulation of ambient air within the upper portion 110. Alternatively, or in addition, the one or more fans 120 may be located within the upper portion 110 to alternatively or additionally force the ingested ambient air 136A to circulate within the upper portion.

The first flow 136A may be vented from the upper portion 110 by way of an upper portion exhaust 122. The upper portion exhaust 122 may comprise a gap between panels of the upper portion housing 114. In exemplary embodiments, the upper portion exhaust 122 may be located along an upper edge of the upper portion 110.

Figure 9B:
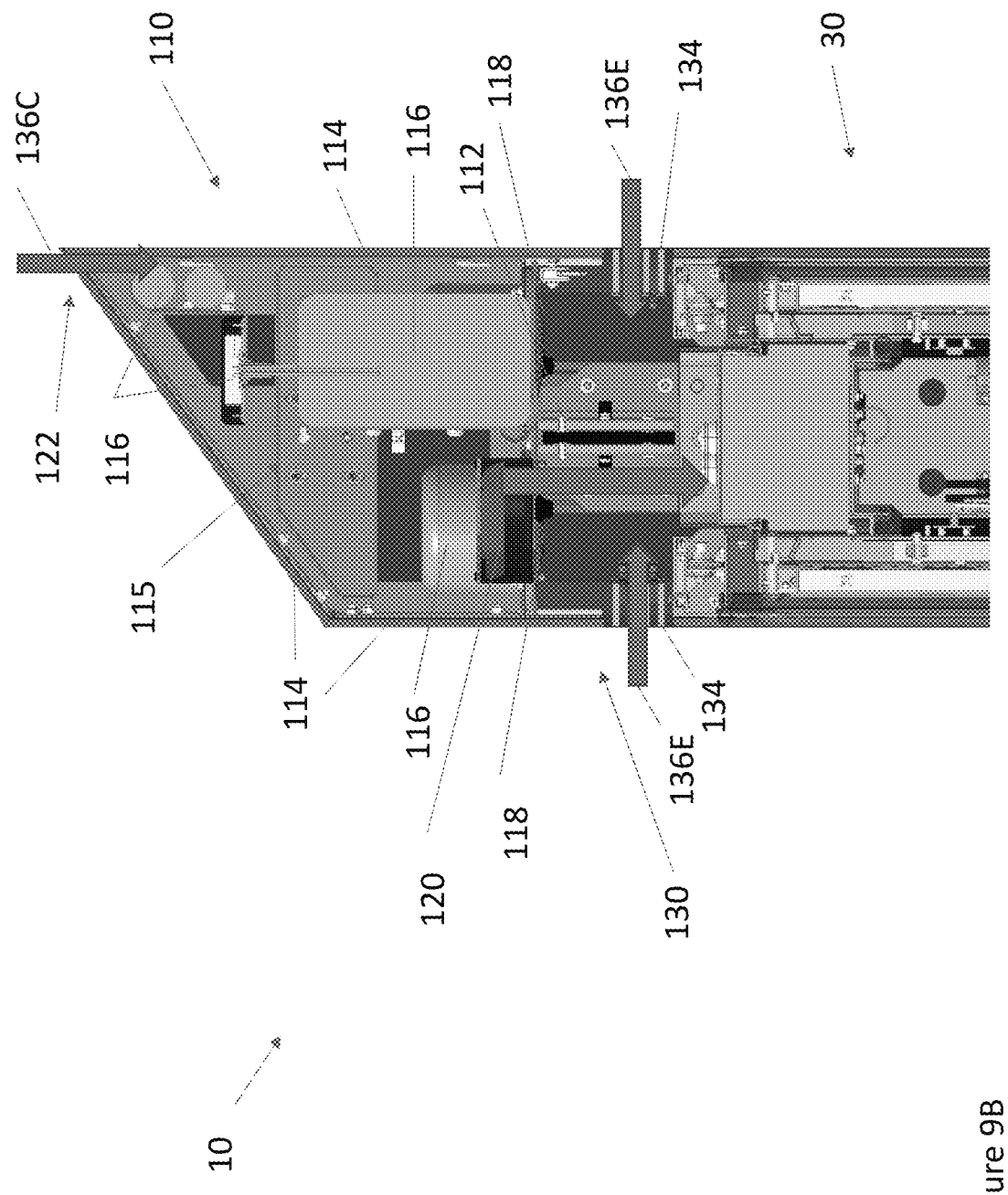
FIG. 9B is a detailed side sectional view of another exemplary embodiment of Detail B of FIG. 8.

As illustrated in FIG. 9B, in other exemplary embodiments, the upper portion exhaust 122 may instead be configured to be an upper portion intake 122. A first flow 136C of ambient air may be ingested by way of the upper portion intake 122. The first flow 136C may travel through the upper portion 110 to the display unit 30. In some embodiments, a second flow 136D of ambient air may be ingested into the transition section 130 for circulation within the display unit 30, though such is not required.

In still other exemplary embodiments, the upper portion 110 may be cooled by convection by way of ambient air passing over the external surfaces of the upper portion 110.

Figure 10:
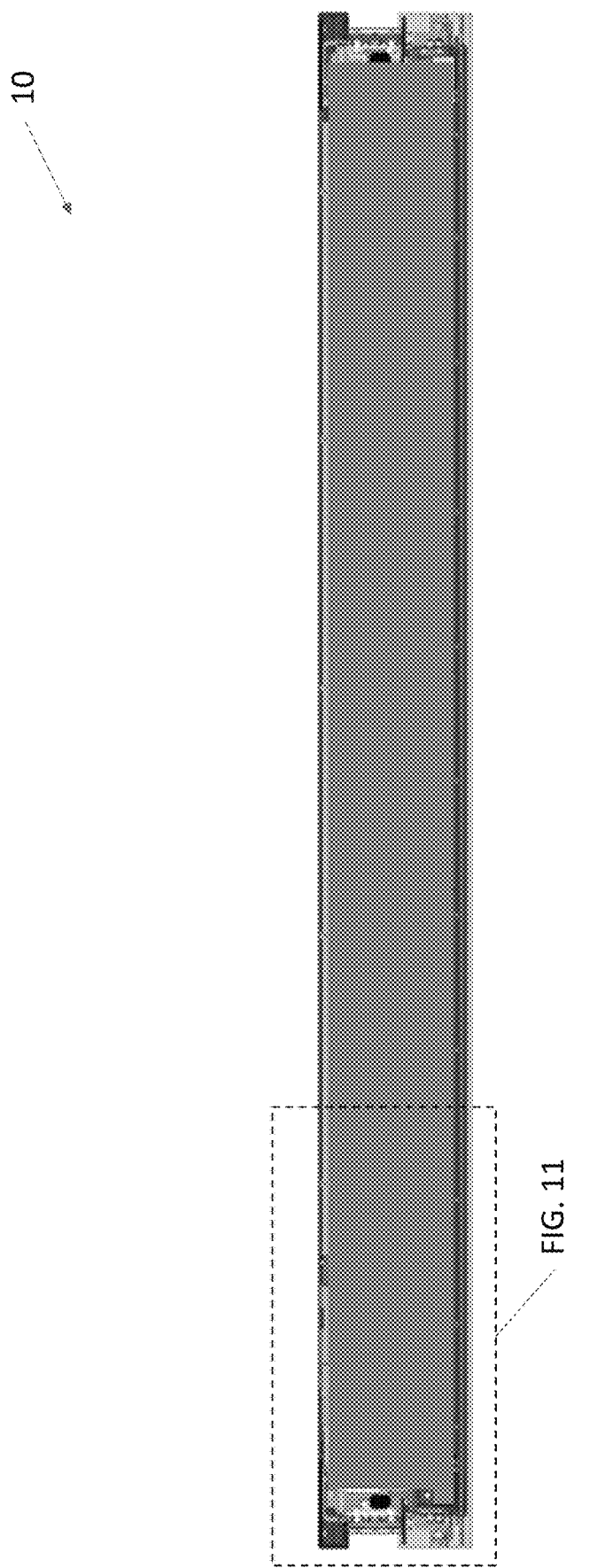
FIG. 10 is a top sectional view of another exemplary housing assembly and an integrated display unit.
Figure 11:
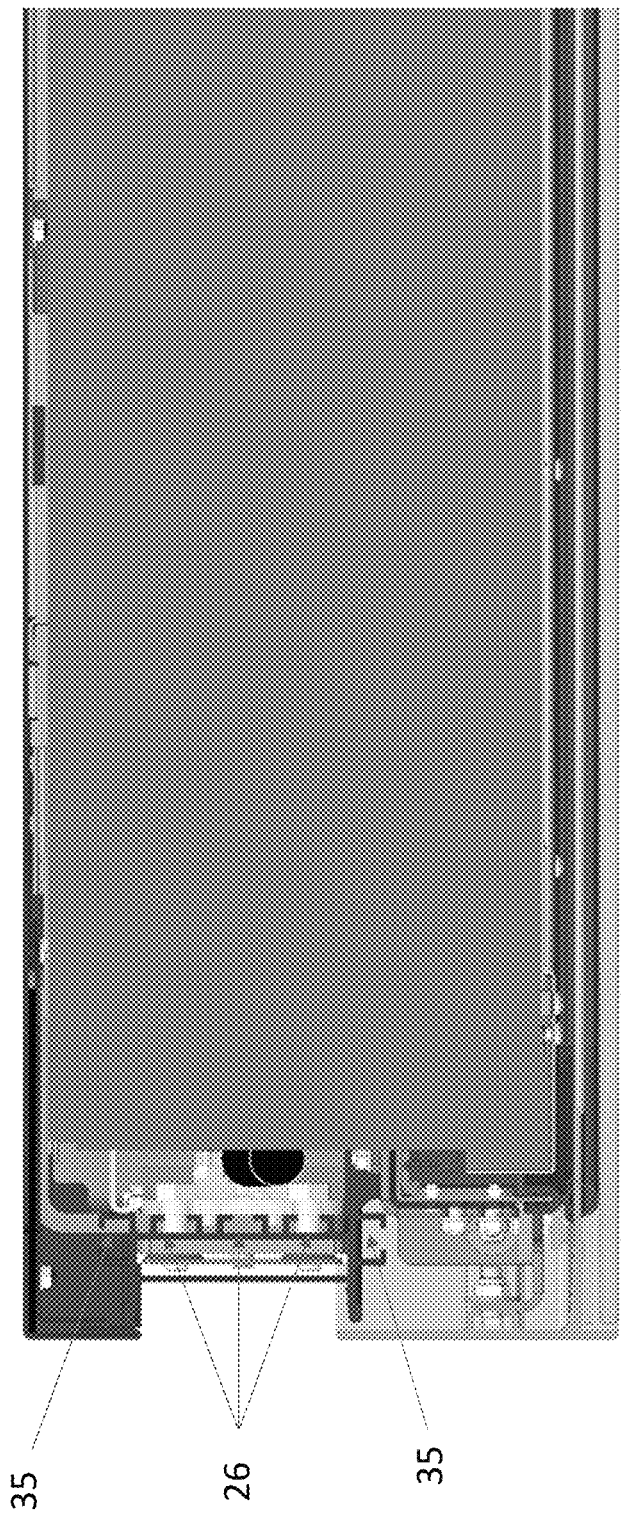
FIG. 11 is a detailed top sectional view of the assembly of FIG. 10.

FIG. 10 is a top sectional view of another exemplary housing assembly and an integrated display unit and FIG. 11 is a detailed top sectional view of the assembly of FIG. 10. These figures are provided to demonstrate, in a simplified fashion, that a landscape orientated assembly 10 with a landscape-oriented display unit 30. Certain internal components of the display units 30 are obscured in the provided drawings to focus attention on the orientation of the display units 30. It is contemplated that the assembly 10 and the display unit 30 may be provided in a portrait orientation, a landscape orientation, or any other orientation, such as but not limited to, various angles, tilts, or rotations.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. An electronic display assembly comprising: a housing assembly; an electronic display supported by the housing assembly; one or more open loop airflow pathways extending through at least a portion of said housing assembly rearward of said electronic display; an upper portion supported by the housing assembly at a position above, and spaced apart from, said electronic display, said upper portion comprising an upper cavity and an upper portion intake/exhaust; one or more intakes provided at a transition area located between said upper portion and said electronic display, where said one or more intakes are in direct fluid connection with an ambient environment, and where said transition area is fluidly connected to said upper cavity and said one or more open loop airflow pathways; and one or more fans, at least one of which is located below said upper portion intake/exhaust and above said one or more open loop airflow pathways, wherein said one or more fans, when activated, move ambient air through said the upper cavity, said upper portion intake/exhaust, said one or more intakes, said transition area, and said one or more open loop airflow pathways such that the ambient air in said transition area comprises a combination of the ambient air directed towards said one or more open loop airflow pathways and to/from said upper portion intake/exhaust through said upper cavity.

2. The electronic display assembly of claim 1 wherein:
said one or more fans comprise:
a first set of one or more fans which, when activated, ingest a first flow of ambient air through said upper portion intake/exhaust and move the first flow of ambient air through said upper cavity and toward said transition area when operated; and
a second set of one or more fans which, when activated, ingest a second flow of ambient air through said one or more intakes of said transition area and mix, at least in part, said second flow of ambient air with said first flow of ambient air and move at least a portion of said mixed flow into said one or more open loop airflow pathways when operated.

3. The electronic display assembly of claim 2 wherein:
said second set of one or more fans are located within said one or more open loop airflow pathways.

4. The electronic display assembly of claim 1 wherein:
said one or more fans comprise:
a second set of one or more fans which, when activated, ingest a flow of ambient air through said one or more intakes of said transition area and direct a first portion of said ingested flow into said one or more open loop airflow pathways when operated; and
a first set of one or more fans which, when activated, direct a second portion of said ingested flow into said upper cavity when operated.

5. The electronic display assembly of claim 1 further comprising:
communication equipment located within said upper cavity.

6. The electronic display assembly of claim 5 further comprising:
one or more apertures in the lower surface of said upper portion which provide, at least in part, said fluid connection between said upper cavity and said transition area.

7. The electronic display assembly of claim 6 wherein:
the at least one of said one or more fans is mounted within said upper cavity atop said one or more apertures.

8. The electronic display assembly of claim 5 wherein:
said upper portion comprises one or more panels forming said upper portion cavity, wherein at least one of said one or more panels comprise black glass.

9. The electronic display assembly of claim 1 further comprising:

a backlight for the electronic display, where at least one of said one or more open loop airflow pathways extends, at least in part, directly along a rear surface of the backlight.

10. The electronic display assembly of claim 9 wherein:
the electronic display comprises a layer of liquid crystals.

11. The electronic display assembly of claim 1 wherein:
said one or more intakes of said transition area comprises at least a first intake located at a first side of said transition area and a second intake located at a second, opposing side of said transition area.

12. The electronic display assembly of claim 1 further comprising:
a closed loop airflow pathway for circulating gas passing around the electronic display.

13. The electronic display assembly of claim 12 further comprising:
a heat exchanger, wherein a first portion of said heat exchanger forms part of said closed loop airflow pathway and a second portion of said heat exchanger forms part of at least one of said one or more open loop airflow pathways.

14. A method for thermally managing an electronic display assembly, said method comprising: operating said electronic display assembly, where said electronic display assembly comprises: a housing assembly; an electronic display supported by the housing assembly; one or more open loop airflow pathways extending within the housing assembly and located, at least in part, behind the electronic display; an upper portion supported by the housing assembly at a position above, and spaced apart from, said electronic display, said upper portion comprising an upper cavity and an upper portion intake/exhaust; a transition area located between said upper portion and said electronic display, said transition area comprising one or more intakes in direct fluid connection with an ambient environment and fluidly connected with said upper cavity and said one or more open loop airflow pathways; and one or more fans, at least one of which is located below said upper portion intake/exhaust and above said one or more open loop airflow pathways; activating said one or more fans to move ambient air between said ambient environment, said upper cavity, said upper portion intake/exhaust, said one or more intakes located at said transition area, said transition area, and said one or more open loop airflow pathways such that the ambient air in said transition area comprises a combination of the ambient air directed towards said one or more open loop airflow pathways and the ambient air directed from/to said upper portion intake/exhaust through said upper cavity.

15. The method of claim 14 wherein:
said electronic display assembly comprises a backlight for the electronic display;
at least a portion of one of said one or more open loop airflow pathways extends directly along a rear surface of the backlight; and
the electronic display comprises a layer of liquid crystals.

16. The method of claim 14 wherein:
the step of activating said one or more fans comprises:
activating a first set of one or more fans to ingest a first flow of ambient air through said upper portion intake/exhaust and move the first flow of ambient air through said upper cavity and toward said transition area when operated; and
activating a second set of one or more fans to ingest a second flow of ambient air through said one or more intakes of said transition area and at least partially mix said second flow of ambient air with said first flow of ambient air and direct at least a portion of said mixed flow into said one or more open loop airflow pathways when operated.

17. The method of claim 14 wherein:
the step of activating said one or more fans comprises:
activating a second set of one or more fans to ingest a flow of ambient air through said one or more intakes of said transition area and move a first portion of said ingested flow into said one or more open loop airflow pathways when operated; and
activating a first set of one or more fans to move a second portion of said ingested flow into said upper cavity for exhaustion through said upper portion intake/exhaust when operated.

18. The method of claim 14 wherein:
said electronic display assembly comprises:
communication equipment located within said upper cavity; and
one or more apertures in the lower surface of said upper portion to provide said fluid connection between said upper cavity and said transition area; and
the at least one of said one or more fans is mounted within said upper cavity atop said one or more apertures.

* * * * *

UNITED STATES PATENT AND TRADEMARK OFFICE
CERTIFICATE OF CORRECTION

| | | |
|---|---|---|
| PATENT NO. | : 12,004,311 B2 | Page 1 of 1 |
| APPLICATION NO. | : 18/541206 | |
| DATED | : June 4, 2024 | |
| INVENTOR(S) | : Dunn | |

It is certified that error appears in the above-identified patent and that said Letters Patent is hereby corrected as shown below:

On the Title Page

In Item (56), References Cited, U.S. Patent Documents, please delete "7,212,403 B2 5/2007 Rockenfell" and insert -- 7,212,403 B2 5/2007 Rockenfeller --.

In Item (56), References Cited, Other Publications, please delete "The American Heritage College Dictionary, Third Edition, 1993, excerpt, 3 pages, Houghton Company." and insert -- The American Heritage College Dictionary, Third Edition, 1993, excerpt, 3 pages, Houghton Mifflin Company. --.

In the Specification

In Column 8, Line 60, please delete "1368" and insert -- 136B --.

Signed and Sealed this
Thirteenth Day of August, 2024

Katherine Kelly Vidal
*Director of the United States Patent and Trademark Office*